(12) United States Patent
Binder et al.

(10) Patent No.: US 9,099,622 B2
(45) Date of Patent: Aug. 4, 2015

(54) OPTOELECTRONIC SEMICONDUCTOR COMPONENT

(75) Inventors: Michael Binder, Manching (DE);
Alexander Linkov, Regensburg (DE);
Thomas Zeiler, Nittendorf (DE); Peter Brick, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 444 days.

(21) Appl. No.: 13/056,811

(22) PCT Filed: Jul. 15, 2009

(86) PCT No.: PCT/DE2009/000988
§ 371 (c)(1),
(2), (4) Date: Apr. 22, 2011

(87) PCT Pub. No.: WO2010/012264
PCT Pub. Date: Feb. 4, 2010

(65) Prior Publication Data
US 2011/0297999 A1    Dec. 8, 2011

(30) Foreign Application Priority Data
Jul. 29, 2008 (DE) .......................... 10 2008 035 255

(51) Int. Cl.
*H01L 33/54* (2010.01)
*H01L 33/44* (2010.01)

(52) U.S. Cl.
CPC ................ *H01L 33/54* (2013.01); *H01L 33/44* (2013.01); *H01L 2933/0091* (2013.01)

(58) Field of Classification Search
CPC ....... H01L 33/20; H01L 25/167; H01L 33/54; H01L 33/44

USPC ............... 257/79–99, 788; 313/498; 250/551; 310/344

See application file for complete search history.

(56) References Cited

U.S. PATENT DOCUMENTS

| | | | |
|---|---|---|---|
| 5,285,076 A * | 2/1994 | Kusuda et al. | 250/551 |
| 5,834,850 A * | 11/1998 | Hotta et al. | 257/788 |
| 6,111,272 A | 8/2000 | Heinen | |
| 7,153,462 B2 | 12/2006 | Chandra | |
| 7,607,801 B2 * | 10/2009 | Suehiro et al. | 362/294 |
| 2002/0153637 A1 | 10/2002 | Chandra | |
| 2003/0089914 A1 | 5/2003 | Chen | |
| 2004/0245530 A1 | 12/2004 | Kameyama et al. | |
| 2005/0006987 A1 * | 1/2005 | Masuko et al. | 310/344 |
| 2006/0049421 A1 * | 3/2006 | Suehiro et al. | 257/99 |

(Continued)

FOREIGN PATENT DOCUMENTS

| EP | 0 905 797 | 3/1999 |
|---|---|---|
| EP | 1 589 569 | 10/2005 |

(Continued)

*Primary Examiner* — Eugene Lee
*Assistant Examiner* — Fang-Xing Jiang
(74) *Attorney, Agent, or Firm* — Cozen O'Connor

(57) ABSTRACT

An optoelectronic semiconductor component is provided, having a connection carrier (2), an optoelectronic semiconductor chip (1), which is arranged on a mounting face (22) of the connection carrier (2), and a radiation-transmissive body (3), which surrounds the semiconductor chip (1), wherein the radiation-transmissive body (3) contains a silicone, the radiation-transmissive body (3) comprises at least one side face (31) which extends at least in places at an angle β of <90° to the mounting face (22) and the side face (3) is produced by a singulation process.

12 Claims, 3 Drawing Sheets

(56) References Cited

U.S. PATENT DOCUMENTS

| | | |
|---|---|---|
| 2006/0164836 A1 | 7/2006 | Suehiro et al. |
| 2007/0176192 A1* | 8/2007 | Leatherdale et al. ........... 257/98 |
| 2007/0228390 A1* | 10/2007 | Hattori et al. .................. 257/79 |
| 2008/0036362 A1* | 2/2008 | Tanimoto et al. ............. 313/498 |

FOREIGN PATENT DOCUMENTS

| | | |
|---|---|---|
| JP | 2001-160629 | 6/2001 |
| JP | 2001-223285 | 8/2001 |
| JP | 2002-368277 | 12/2002 |
| JP | 2003-347596 | 12/2003 |
| JP | 2004-095580 | 3/2004 |
| JP | 2004-235337 | 8/2004 |
| JP | 2006 059851 | 3/2006 |
| JP | 2006-080312 | 3/2006 |
| JP | 2006 100529 | 4/2006 |
| JP | 2006 245066 | 9/2006 |
| JP | 2007/142277 | 6/2007 |
| JP | 2007 294728 | 11/2007 |
| WO | WO 02/13281 | 2/2002 |
| WO | WO 2005/017995 | 2/2005 |
| WO | WO 2005/043637 | 5/2005 |
| WO | WO 2007/091696 | 8/2007 |

* cited by examiner

OPTOELECTRONIC SEMICONDUCTOR COMPONENT

This is a U.S. national stage of application No. PCT/DE2009/000988, filed on Jul. 15, 2009, and claims priority on German patent application No. 10 2008 035 255.1, filed on Jul. 29, 2008, the disclosure content of which is hereby incorporated by reference.

FIELD OF THE INVENTION

An optoelectronic semiconductor component is provided.

SUMMARY OF THE INVENTION

According to at least one embodiment of the optoelectronic semiconductor component, the optoelectronic semiconductor component comprises a connection carrier. The connection carrier comprises for example a circuit board, which comprises a base member consisting of an electrically insulating material. Electrical connection tracks and conductive tracks may be structured on and/or in the base member.

According to at least one embodiment of the optoelectronic semiconductor component, the optoelectronic semiconductor component comprises an optoelectronic semiconductor chip. The optoelectronic semiconductor chip comprises a radiation-emitting or radiation-receiving semiconductor chip. For example, the optoelectronic semiconductor chip is a luminescent diode chip, that is to say that the optoelectronic semiconductor chip takes the form of a light-emitting diode chip or a laser diode chip. The optoelectronic semiconductor chip is arranged on a mounting face of the contact carrier, to which the optoelectronic semiconductor chip may be attached mechanically and electrically contacted.

According to at least one embodiment of the optoelectronic semiconductor component, the optoelectronic semiconductor component comprises a radiation-transmissive body, surrounding the semiconductor chip. The radiation-transmission body comprises for example an encapsulating body of an encapsulating material, with which the semiconductor chip is encapsulated. The radiation-transmissive body preferably envelops the semiconductor chip in a form-fitting manner, that is to say the semiconductor chip is embedded in the material of the radiation-transmissive body and its faces which do not face the connection carrier are surrounded in form-fitting manner by the material of the radiation-transmissive body. At said faces the radiation-transmissive body is for example in direct contact with the semiconductor chip. The radiation-transmissive body is in this case transmissive at least for some of the electromagnetic radiation generated by the semiconductor chip when in operation.

According to at least one embodiment of the optoelectronic semiconductor component, the radiation-transmissive body contains a silicone. The radiation-transmissive body may here consist of silicone. It is additionally possible for particles of other materials such as for example diffuser particles, radiation-absorbing particles or particles of a luminescence conversion material to be introduced into the radiation-transmissive body. It is furthermore possible for the radiation-transmissive body to be made of a silicone-epoxy hybrid material. The radiation-transmissive body then comprises for example 50% epoxy material and 50% silicone.

According to at least one embodiment of the optoelectronic semiconductor component, the radiation-transmissive body comprises at least one side face, which extends at least in places at an angle of <90° to the mounting face, that is to say the side face does not extend perpendicularly to the connection carrier. The side face is thus not perpendicular to the mounting face of the connection carrier. Instead, at least part of the side face forms an angle of <90° with the mounting face. The fact that the side face forms an angle of <90° with the mounting face of the connection carrier also means that the side face has a slope angle of >0°. The slope angle is the angle which the side face forms with a surface normal to the mounting face of the connection carrier.

The side face is in this case preferably substantially planar and the entire side face forms an angle of <90° with the mounting face of the connection carrier. "Substantially planar" means that the side face may exhibit roughness, but that the macroscopic profile of the side face is however planar or smooth.

All in all, according to at least one embodiment the optoelectronic semiconductor component thus comprises a radiation-transmissive body which comprises at least one bevelled or sloping side face. The radiation-transmissive body is thus not cuboidal in configuration, but rather has at least one bevelled side face.

According to at least one embodiment of the optoelectronic semiconductor component, the side face is produced by a singulation process, that is to say the side face is not produced by an encapsulating method using a mould but rather the bevelled or sloping side face is produced by a singulation process. This further means that the side face exhibits traces of a singulation process. For example, the side face bears traces of material abrasion. The feature that the side face "is produced by a singulation process" is thus a product-related feature, which is detectable on the finished optoelectronic semiconductor component as a result of the singulation traces. The roughness of the side face produced by the singulation process here depends on the material of the radiation-transmissive body and on the singulation means used, for example on the saw blade used.

According to at least one embodiment of the optoelectronic semiconductor component, the optoelectronic semiconductor component comprises a connection carrier, an optoelectronic semiconductor chip, which is arranged on a mounting face of the connection carrier, and a radiation-transmissive body, which surrounds the semiconductor chip, the radiation-transmissive body containing a silicone and the radiation-transmissive body comprising at least one side face which extends at least in places at an angle of <90° to the mounting face, the side face being produced by a singulation process.

The optoelectronic semiconductor component is based inter alia on the following recognition: conventionally, a radiation-transmissive encapsulating body is given the desired shape by an encapsulating process. The encapsulating body has to be adjusted to the optoelectronic semiconductor chip. This adjustment of encapsulating body to optoelectronic semiconductor chip is complicated. In addition, it is complicated to produce connection carriers with the necessary small tolerances. If side faces of the radiation-transmissive body are produced by a singulation process after encapsulation, and the optical shape of the radiation-transmissive encapsulating body is thus not defined until after encapsulation, it is particularly simple to change the shape of the radiation-transmissive body and adjust the actual position of the optoelectronic semiconductor chip on the mounting face of the connection carrier. For example, adjustment marks may be present on the mounting face of the connection carrier, with the assistance of which the sloping side faces of the radiation-transmission body may be particularly precisely produced. It has, moreover, been found that bevelled or sloping side faces of the radiation-transmissive body help to increase the efficiency with which electromagnetic radiation generated in the semiconductor chip is outcoupled by the radiation-transmissive body out of the optoelectronic semiconductor component.

According to at least one embodiment of the optoelectronic semiconductor chip, the at least one side face, which extends at least in places at an angle of <90° to the mounting face, is produced by a sawing process, that is to say the side face then exhibits traces of a sawing process. The side face may for example comprise grooves, which were produced by the saw blades with which the side face was produced.

According to at least one embodiment of the optoelectronic semiconductor component, the radiation-transmissive body comprises at least one side face, which extends at least in places at an angle of between 60° and 70° to the mounting face and is produced by a singulation process. It has been found that the angular range of between 60° and 70° between sloping side face and mounting face may be ideal in terms of the outcoupling of electromagnetic radiation out of the radiation-transmissive body. Outcoupling efficiency may be increased by up to 13% relative to side faces which extend at a 90° angle to the mounting face of the connection carrier.

According to at least one embodiment of the optoelectronic semiconductor component, the radiation-transmissive body comprises at least two side faces, which extend at least in places at an angle of <90° to the mounting face and are in each case produced by a singulation process. Preferably, the at least two side faces extend in an angular range of between 60° and 70° to the mounting face.

Particularly preferably, four side faces of the radiation-transmissive body extend at an angle of between 60° and 70° to the mounting face and are produced by a singulation process. The four side faces are here of substantially planar configuration, that is to say apart from singulation traces on the side faces said side faces extend in planar manner.

This means that the radiation-transmissive body takes the form of a truncated pyramid. The side faces of the truncated pyramid are here produced by a singulation process, in particular by a sawing process. The side faces preferably form an angle of <90°, particularly preferably an angle of between 60° and 70°, with the mounting face of the connection carrier. The truncated pyramid comprises a rectangular, for example a square base area, for example.

According to at least one embodiment of the optoelectronic semiconductor component, the radiation-transmissive body directly adjoins the mounting face of the connection carrier, that is to say the radiation-transmissive body is in direct contact with the mounting face of the connection carrier. It is additionally possible for at least one layer, for example a foil, to be arranged between radiation-transmissive body and connection carrier, which layer increases adhesion between the radiation-transmissive body and the connection carrier. The layer may, for example, comprise a silicone foil.

According to at least one embodiment of the optoelectronic semiconductor component, the connection carrier is made of a ceramic material. The connection carrier may for example comprise a base member which consists of a ceramic material such as aluminium nitride or aluminium oxide. Electrical connection tracks and/or conductive tracks may be structured on the base member at the connection carrier mounting face. These may for example take the form of metal coatings, which are vapour-deposited onto the base member or applied in some other way.

It is furthermore possible for the connection carrier to comprise at least two electrical connection points on its base member, on the side remote from the mounting face, by means of which connection points the semiconductor chip of the optoelectronic semiconductor component may be electrically contacted. In this case the optoelectronic semiconductor component is of surface-mountable configuration. The connection points may in this case be connected with connection points and conductive tracks on the mounting face of the connection carrier by means of openings in the base member of the connection carrier or via metal coatings, which extend along side faces of the connection carrier.

According to at least one embodiment of the optoelectronic semiconductor component, a planarisation layer is applied to at least one side face of the radiation-transmissive body, which side face is produced by a singulation process. As a result of producing the side face by a singulation process, the side face comprises singulation traces. These singulation traces may lead to optical disturbance of the exiting light. For example, the light passing through the side face may be undesirably refracted or scattered at these singulation traces. To prevent such refraction or scattering, a planarisation layer may be applied to the side face, which layer evens out the unevennesses caused by the singulation traces. A layer of silicone is sprayed onto the side face, for example.

A method of producing an optoelectronic semiconductor component is additionally provided. The method preferably allows production of an optoelectronic semiconductor component as described in relation to at least one of the preceding embodiments, that is to say all the features disclosed in relation to the optoelectronic semiconductor component are also disclosed in relation to the method.

The method preferably comprises the following steps:
providing a connection carrier,
attaching and electrically contacting an optoelectronic semiconductor chip to a mounting face of the connection carrier,
moulding a radiation-transmissive body around the optoelectronic semiconductor chip and
sawing the radiation-transmissive body at an angle of <90° to the mounting face of the connection carrier in order at least in places to produce a side face of the radiation-transmissive body.

The optical shape of the radiation-transmissive body is defined by a singulation process, for example a sawing process. The shape of the radiation-transmissive body may be readily modified by different shaped saw blades, which are quick and easy to change. When conventional encapsulating methods are used, this is associated with considerable costs for modifying or producing the mould. Moreover, in conventional encapsulating methods, connection carrier production tolerances have to be kept very small or additional complex process steps such as an adjusting step have to be carried out, in order to keep the relative position of the optical system, i.e. of radiation-transmissive body and chip, within acceptable limits. Connection carriers with small tolerances are significantly more expensive. In the method described herein, saw markings on the connection carrier, for example, which in conventional methods merely assist in the sawing process for singulating the components, simultaneously define the position of the optical system relative to the semiconductor chip.

According to at least one embodiment of the method, the radiation-transmissive body is produced by means of compression moulding, liquid transfer moulding, liquid injection moulding or casting, wherein the connection carrier may form part of the mould. Compression moulding is an effective method of producing encapsulating bodies for semiconductor chips. In this process, the material for the encapsulating body is introduced into the mould and the connection carrier is pressed into the material located in the mould.

In a modification of compression moulding, solid, granular material may also be used, for example silicone-epoxy hybrid material. In this case, the material may also be applied to the connection carrier and the semiconductor chip before the mould is closed. The seal between connection carrier and mould may be brought about for example by way of a sealing foil, which is removed after the compression moulding process.

If solid materials, for instance hybrid materials, pressed into tablet shape for example, are used, the encapsulating body may also be produced by means of transfer moulding.

Document WO 2005/017995 A1 describes liquid injection moulding of semiconductor components, for example. Casting of semiconductor components is described in document EP 1 589 569 A2 and liquid transfer moulding of integrated semiconductor circuits is described in document US 2002/0153637 A1. These documents are hereby expressly included by reference with regard to the methods described therein.

According to at least one embodiment of the method, a planarisation layer is sprayed onto the sawn side faces of the radiation-transmissive body once the sawn side face has been produced. The planarisation layer planarises singulation traces in the radiation-transmissive body.

BRIEF DESCRIPTION OF THE DRAWINGS

The optoelectronic semiconductor component described herein is explained in greater detail below with reference to exemplary embodiments and the associated figures.

DETAILED DESCRIPTION OF THE DRAWINGS

Figure 1A:
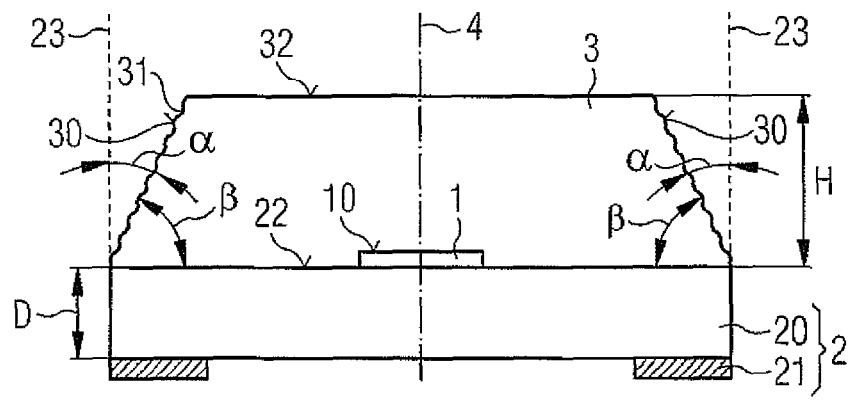
FIG. 1A is a schematic sectional representation of an optoelectronic semiconductor component described herein according to a first exemplary embodiment.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

FIG. 1A is a schematic sectional representation of an optoelectronic semiconductor component described herein according to a first exemplary embodiment. The semiconductor component comprises an optoelectronic semiconductor chip 1. In this case, the optoelectronic semiconductor chip 1 is a light-emitting diode chip, of thin-film construction. Light-emitting diode chips of thin-film construction are described for example in documents WO 02/13281 A1 and EP 0 905 797 A2, the disclosure content of which is hereby expressly included by reference with regard to the thin-film construction of light-emitting diode chips.

The optoelectronic semiconductor chip 1 is applied to the mounting face 22 of a connection carrier 2. The connection carrier 2 further comprises a base member 20, which is here made of a ceramic material. Electrical connection points 21 are applied to the bottom, opposite the mounting face 22, of the base member 20 of the connection carrier 2, by way of which connection points 22 the optoelectronic semiconductor component is surface-mountable. The optoelectronic semiconductor chip 1 is encapsulated in a radiation-transmissive body 3.

The radiation-transmissive body 3 envelops the optoelectronic semiconductor chip 1 in form-fitting manner. The radiation-transmissive body 3 here consists of a silicone. The radiation-transmissive body 3 directly adjoins the mounting face 22 of the connection carrier 2. The radiation-transmissive body 3 comprises side faces 30. The side faces 30 extend in planar manner, apart from singulation traces 31, which are shown exaggeratedly large in FIG. 1A to make them more visible. The side faces 30 form an angle of β of <90° with the mounting face 22 of the connection carrier 2, that is to say the slope angle α, which is obtained from the angle of the side face 30 with the surface normal 23 to the mounting face 22, is >0°.

The side faces 30 are produced by a sawing process. The singulation traces 31 comprise saw grooves or other defects such as for example indentations, which arise when material is "torn out" of the radiation-transmissive body 3 during sawing.

The optoelectronic semiconductor chip 1 may be arranged centred relative to the radiation-transmissive body 3 and to the connection carrier 2, that is to say the optical axis 4 through the centre of the radiation exit face 10 of the optoelectronic semiconductor chip 1 then constitutes an axis of symmetry of the optoelectronic semiconductor component. The above-described centring is desirable above all with regard to particularly symmetrical emission. However, non-centred configurations are also possible.

The optoelectronic semiconductor chip 1 is adjusted relative to the radiation-transmissive body 3 during the singulation process for example by means of adjustment marks, not shown, on the mounting surface 22 of the connection carrier 2.

Figure 1B:
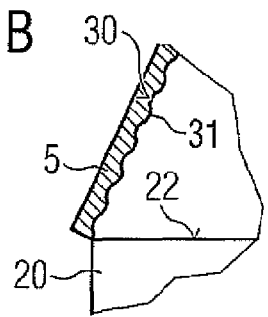
FIG. 1B shows an enlarged portion of an optoelectronic semiconductor component described herein in a second exemplary embodiment.

FIG. 1B shows an enlarged portion of an optoelectronic semiconductor component described herein according to a second exemplary embodiment. Unlike the exemplary embodiment described in conjunction with FIG. 1A, in this exemplary embodiment a planarisation layer 5 has been arranged on the side face 30 produced by a singulation process. The planarisation layer 5 has in this case been sprayed onto the side face 30. The planarisation layer 5 here consists of silicone. The planarisation layer 5 evens out the unevennesses of the side face 30 produced by the singulation traces 31.

Figure 1C:
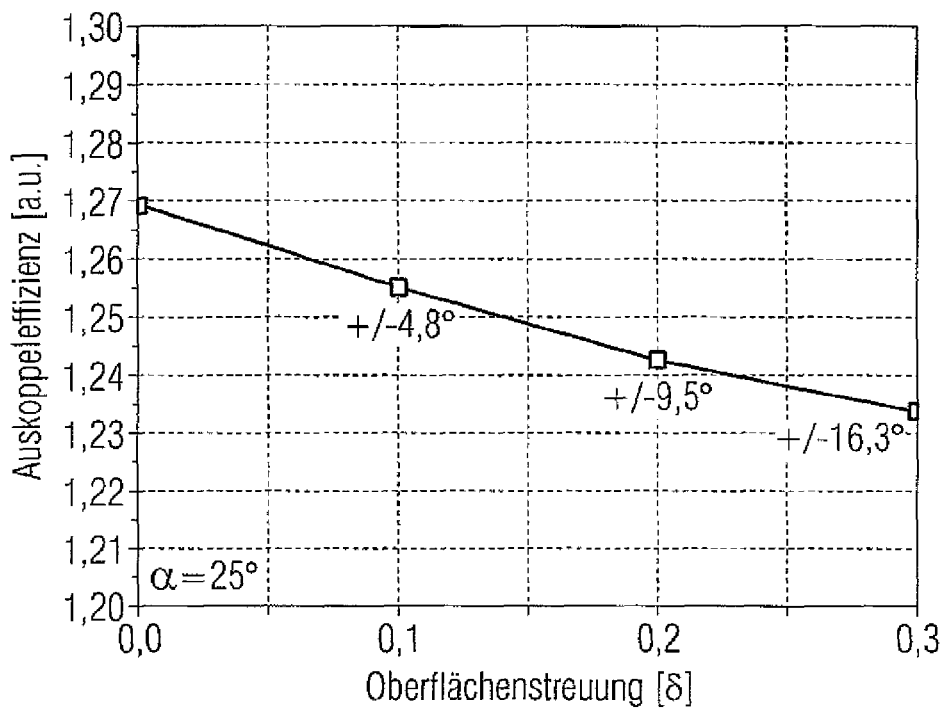
FIG. 1C schematically plots outcoupling efficiency as a function of surface scattering for one exemplary embodiment of an optoelectronic semiconductor component described herein.

To this end, FIG. 1C shows a schematic plot of outcoupling efficiency in the case of a slope angle α of 25° as a function of surface scattering at the radiation-transmissive body 3. It is assumed that the radiation-transmissive body consists of silicone and has a height H of 400 µm. The base member 20 of the connection carrier 2 consists of a ceramic material and has a thickness D of 200 µm. It is apparent from FIG. 1C that outcoupling efficiency falls with increasing surface scattering at side faces 30 of the radiation-transmissive body 3. Unevennesses on the side faces 30 of the radiation-transmissive body increase surface scattering. The planarisation layer 5 therefore proves particularly advantageous with regard to outcoupling efficiency.

Figure 2:
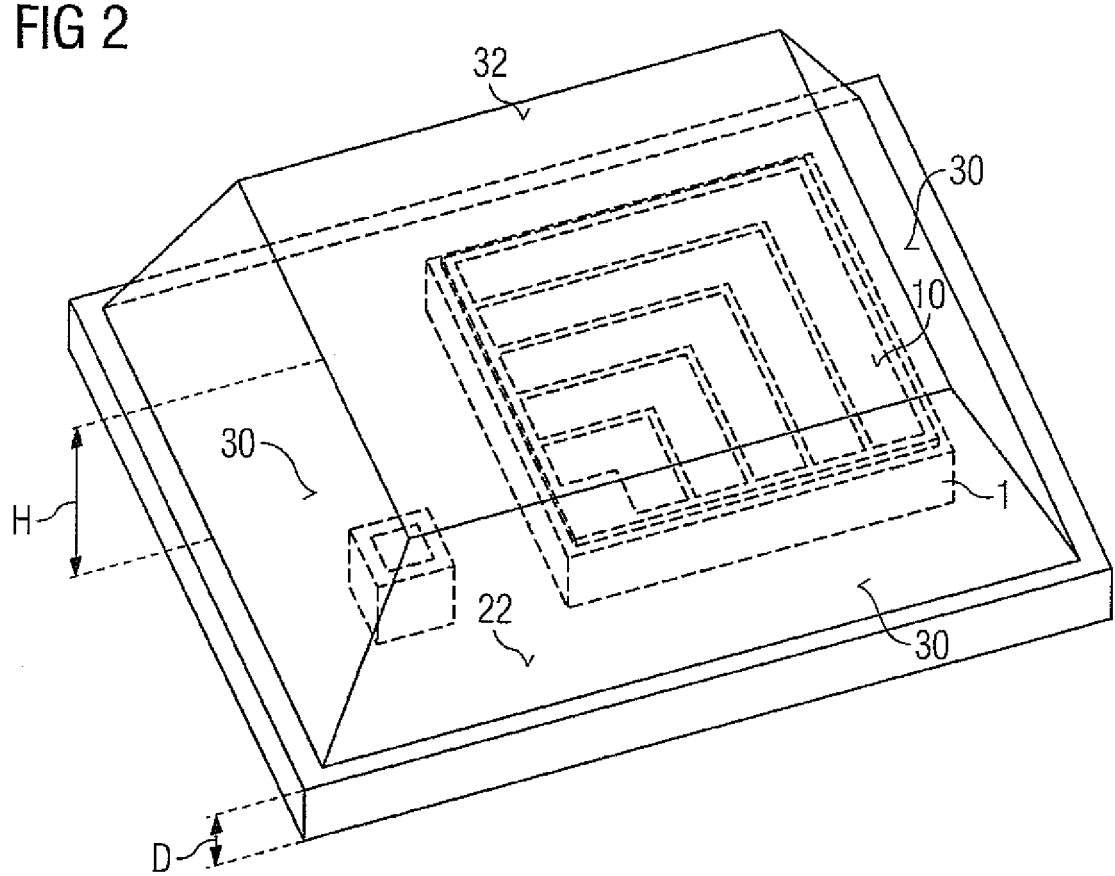
FIG. 2 is a schematic perspective representation of an optoelectronic semiconductor component described herein according to a further exemplary embodiment.

A further exemplary embodiment of an optoelectronic semiconductor component described herein is explained in greater detail in conjunction with the schematic perspective representation of FIG. 2.

As is clear from FIG. 2, the radiation-transmissive body 3 takes the form of a truncated pyramid, which comprises four sloping side faces 30, which are produced by means of a singulation process, in the present case sawing.

The connection carrier 2 comprises a base member 20 of a ceramic material, which has a thickness D of preferably at least 0.2 mm and at most 0.5 mm, for example 0.4 mm. The radiation-transmissive body 3 has a height H preferably of between 0.55 mm and 0.25 mm, for example of 0.35 mm. The sum of the thickness of the main body 20 and height H of the radiation-transmissive body 3 preferably amounts to between 0.7 mm and 0.8 mm, for example 0.75 mm.

The slope angle α amounts for example to 25°. The area of the top face 32 of the radiation-transmissive body preferably amounts to between 2.0 and 2.5 mm$^2$, for example 2.3 mm$^2$.

The connection carrier 2 has a base area, for example, of 2.04 mm×1.64 mm.

The optoelectronic semiconductor chip 1 comprises a radiation exit face 10, which may have an area of 500 μm$^2$ to 1.5 mm$^2$, for example 1.0 mm$^2$. The radiation exit face 10 may be square.

Figure 3:
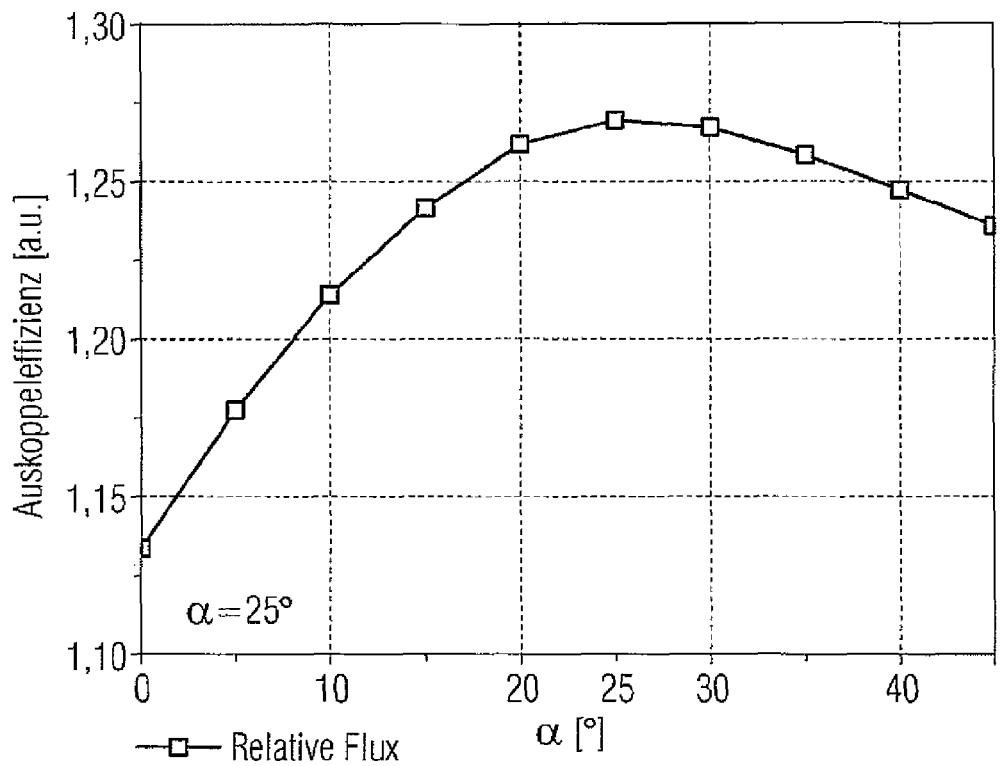
FIG. 3 shows simulations of outcoupling efficiency as a function of slope angle for one exemplary embodiment of an optoelectronic semiconductor component described herein.

FIG. 3 shows simulation results for the outcoupling efficiency of an optoelectronic semiconductor component, as shown in conjunction with FIG. 2.

As may be inferred from FIG. 3, outcoupling efficiency reaches its maximum for a slope angle α=25°. Outcoupling efficiency is increased by around 13% over a structure with a slope angle=0°. The maximum around the slope angle of 25° is relatively flat, resulting in a wide angular tolerance range of +/−5° for optimum outcoupling, so providing a wide process window for mass production of the optoelectronic semiconductor component. The preferred angular range for the slope angle is therefore between 20° and 30°, preferably 25°. This ideal angle is however also dependent on the size of the base area of the connection carrier 2 and may therefore differ for larger structures. It is important for the radiation-transmissive body to comprise at least one side face 30 which extends at least in places at an angle β of <90° to the mounting face 22.

Figure 4:
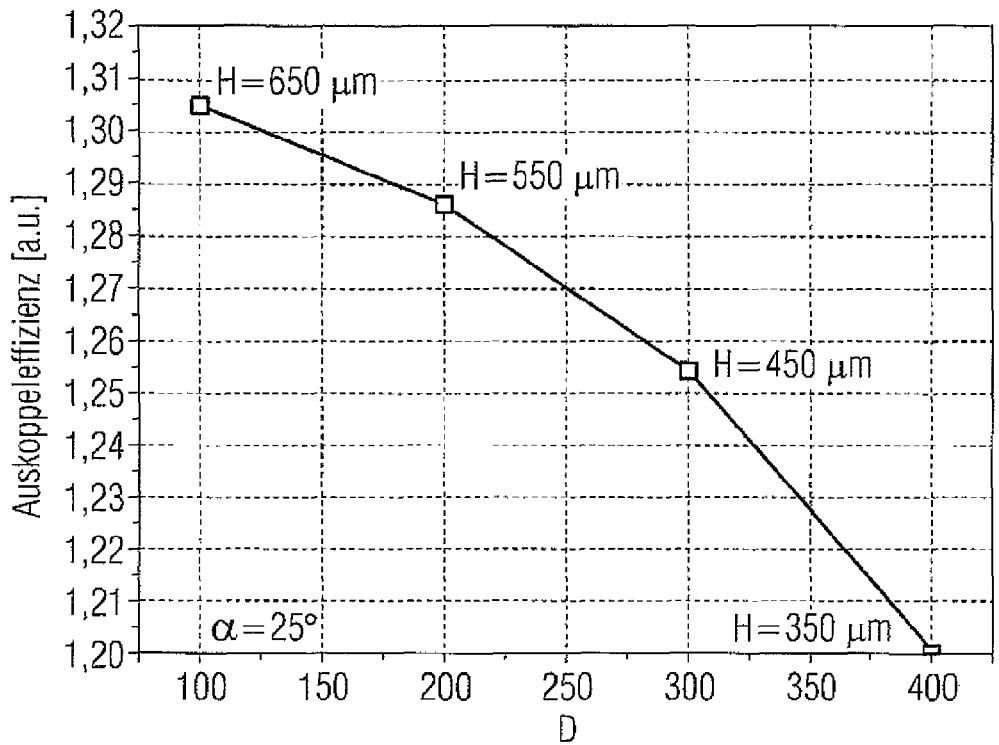
FIG. 4 shows simulations of outcoupling efficiency as a function of the thickness of the base member of the connection carrier for one exemplary embodiment of an optoelectronic semiconductor component described herein.

FIG. 4 shows simulation results for the outcoupling efficiency of an optoelectronic semiconductor component, as shown in conjunction with FIG. 2. Outcoupling efficiency is here plotted against the thickness D of the main body 20 of the connection carrier 2. The height H of the radiation-transmissive body 3 is selected in each case such that the sum of thickness D and height H is 750 μm. As may be inferred from the figure, the outcoupling efficiency is greater, the thinner is the connection carrier. A thickness of the main body D of at most 250 μm is therefore preferred.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor component comprising:
   a connection carrier;
   an optoelectronic semiconductor chip, which is arranged on a mounting face of the connection carrier; and
   a radiation-transmissive body, which surrounds the semiconductor chip in such a way that the radiation-transmissive body envelops outer faces of the optoelectronic semiconductor chip not facing the connection carrier in form-fitting manner,
   wherein the radiation-transmissive body contains a silicone,
   wherein the radiation-transmissive body comprises four side faces, wherein each of the four side faces extends completely at an angle of less than 90° to the mounting face, such that the radiation-transmissive body takes the form of a truncated pyramid,
   wherein the side faces exhibit traces of a singulation process,
   wherein each of the four side faces is produced in its entirety by an inclined sawing process, and
   wherein the radiation-transmissive body comprises at least one side face, which extends at least in places at an angle of between 60° and 70° to the mounting face.

2. The optoelectronic semiconductor component according to claim 1, wherein the at least one side face, which extends at least in places at an angle of between 60° and 70° to the mounting face, is produced by a singulation process.

3. The optoelectronic semiconductor component according to claim 1, wherein the radiation-transmissive body comprises at least two side faces, which extend at least in places at an angle of less than 90° to the mounting face and are in each case produced by a singulation process.

4. The optoelectronic semiconductor component according to claim 3, wherein the radiation-transmissive body comprises at least two side faces, which extend at least in places at an angle of between 60° and 70° to the mounting face and are in each case produced by a singulation process.

5. The optoelectronic semiconductor component according to claim 1, wherein the radiation-transmissive body directly adjoins the mounting face of the connection carrier.

6. The optoelectronic semiconductor component according to claim 1, wherein a planarisation layer is applied to the at least one side face of the radiation-transmissive body, which side face is produced by a singulation process.

7. The optoelectronic semiconductor component according to claim 1, wherein the connection carrier comprises a base member, which is made of a ceramic material, wherein the base member has a thickness which amounts to at most 250 μm.

8. An optoelectronic semiconductor component comprising:
   a connection carrier;
   an optoelectronic semiconductor chip, which is arranged on a mounting face of the connection carrier; and
   a radiation-transmissive body, which surrounds the semiconductor chip in such a way that the radiation-transmissive body envelops outer faces of the optoelectronic semiconductor chip not facing the connection carrier, in form-fitting manner, wherein
   the radiation-transmissive body contains a silicone, wherein the radiation-transmissive body comprises four side faces, wherein each of the four side faces extends completely at an angle of between 60° and 70° to the mounting faces, such that the radiation-transmissive body takes the form of a truncated pyramid,
   wherein the side faces exhibit traces of a singulation process, and
   wherein each of the four side faces is produced in its entirety by an inclined sawing process.

9. An optoelectronic semiconductor component comprising:
- a connection carrier;
- an optoelectronic semiconductor chip, which is arranged on a mounting face of the connection carrier; and
- a radiation-transmissive body, which surrounds the semiconductor chip in such a way that the radiation-transmissive body envelops outer faces of the optoelectronic semiconductor chip not facing the connection carrier in form-fitting manner,
- wherein the radiation-transmissive body contains a silicone,
- wherein the radiation-transmissive body comprises four side faces, wherein each of the four side faces extends completely at an angle of less than 90° to the mounting face, such that the radiation-transmissive body takes the form of a truncated pyramid,
- wherein the side faces exhibit traces of a singulation process,
- wherein each of the four side faces is produced in its entirety by an inclined sawing process,
- wherein the radiation-transmissive body comprises at least one side face, which extends at least in places at an angle of between 60° and 70° to the mounting face, and
- wherein the truncated pyramid has a base area that adjoins the mounting face and a top area that is arranged at the side of the truncated pyramid facing away from the mounting face, wherein the base area is larger than the top area.

10. The optoelectronic semiconductor component according to claim 8, wherein the truncated pyramid has a base area that adjoins the mounting face and a top area that is arranged at the side of the truncated pyramid facing away from the mounting face, wherein the base area is larger than the top area.

11. A method of producing an optoelectronic semiconductor component including a connection carrier; an optoelectronic semiconductor chip, which is arranged on a mounting face of the connection carrier; and a radiation-transmissive body, which surrounds the semiconductor chip in such a way that the radiation-transmissive body envelops outer faces of the optoelectronic semiconductor chip, which do not face the connection carrier, in form-fitting manner, wherein the radiation-transmissive body contains a silicone, the radiation-transmissive body comprises at least one side face which extends at least in places at an angle of less than 90° to the mounting face, and the side face exhibits traces of a singulation process, the method further comprising the steps of:
- providing the connection carrier;
- attaching and electrically contacting the optoelectronic semiconductor chip to the mounting face of the connection carrier;
- molding the radiation-transmissive body around the optoelectronic semiconductor chip; and
- wherein the radiation-transmissive body comprises at least one side face, which extends at least in places at an angle of between 60° and 70° to the mounting face.

12. The method according to claim 11, wherein a planarisation layer is sprayed onto the sawn side face of the radiation-transmissive body.

* * * * *

UNITED STATES PATENT AND TRADEMARK OFFICE
CERTIFICATE OF CORRECTION

PATENT NO. : 9,099,622 B2
APPLICATION NO. : 13/056811
DATED : August 4, 2015
INVENTOR(S) : Michael Binder et al.

It is certified that error appears in the above-identified patent and that said Letters Patent is hereby corrected as shown below:

In the claims,

Column 10, line 5, claim 11, should read as follows:

11. A method of producing an optoelectronic semiconductor component including a connection carrier; an optoelectronic semiconductor chip, which is arranged on a mounting face of the connection carrier; and a radiation-transmissive body, which surrounds the semiconductor chip in such a way that the radiation-transmissive body envelops outer faces of the optoelectronic semiconductor chip, which do not face the connection carrier, in form-fitting manner, wherein the radiation-transmissive body contains a silicone, the radiation-transmissive body comprises at least one side face which extends at least in places at an angle of less than 90° to the mounting face, and the side face exhibits traces of a singulation process, the method further comprising the steps of:
    providing the connection carrier;
    attaching and electrically contacting the optoelectronic semiconductor chip to the mounting face of the connection carrier;
    molding the radiation-transmissive body around the optoelectronic semiconductor chip; and
    sawing the radiation-transmissive body at an angle of <90° to the mounting face of the connection carrier in order at least in places to produce the side face of the radiation-transmissive body,
    wherein the radiation-transmissive body comprises at least one side face, which extends at least in places at an angle of between 60° and 70° to the mounting face.

Signed and Sealed this
Third Day of May, 2016

Michelle K. Lee
*Director of the United States Patent and Trademark Office*